United States Patent
Hersman et al.

(10) Patent No.: US 6,949,169 B2
(45) Date of Patent: Sep. 27, 2005

(54) APPARATUS AND METHOD FOR POLARIZING POLARIZABLE NUCLEAR SPECIES

(75) Inventors: F. William Hersman, Durham, NH (US); Mark Leuschner, Newmarket, NH (US); Jeannette Carberry, Merrimack, NH (US)

(73) Assignee: University of New Hampshire, Durham, NH (US)

( * ) Notice: Subject to any disclaimer, the term of this patent is extended or adjusted under 35 U.S.C. 154(b) by 472 days.

(21) Appl. No.: 09/904,294

(22) Filed: Jul. 12, 2001

(65) Prior Publication Data

US 2002/0107439 A1 Aug. 8, 2002

Related U.S. Application Data (60) Provisional application No. 60/217,569, filed on Jul. 12, 2000.

(51) Int. Cl.[7] .................................................. C25B 5/00
(52) U.S. Cl. ....................................................... 204/155
(58) Field of Search ......................................... 204/155

(56) References Cited

U.S. PATENT DOCUMENTS

| | | |
|---|---|---|
| 3,904,272 A | 9/1975 | Straka |
| 4,793,357 A | 12/1988 | Lindstrom |
| 5,545,396 A | 8/1996 | Albert et al. |
| 5,617,859 A | 4/1997 | Souza et al. |
| 5,642,625 A | 7/1997 | Cates, Jr. et al. |
| 5,934,103 A * | 8/1999 | Ryan et al. ................... 62/637 |
| 6,434,284 B1 | 8/2002 | Savchenko |

FOREIGN PATENT DOCUMENTS

| | | |
|---|---|---|
| WO | WO 99/34189 | 7/1999 |

OTHER PUBLICATIONS

European Search Report Apr. 14, 2004.
Driehuys, et al., High–volume production of laser–polarized Xe, Applied Physics Letters, American Institute of Physics, vol. 69, No. 12, Sep. 16, 1996, p. 1668–1670, New York.
Rosen, et al., Polarized Xe optical pumping/spin exchange and delivery system for magnetic resonance spectroscopy and imaging studies, Review of Scientific Instruments, American Institute of Physics, vol. 70, No. 2, Feb. 1999, p. 1546–1552, New York.

* cited by examiner

*Primary Examiner*—Edna Wong
(74) *Attorney, Agent, or Firm*—Devine, Millimet & Branch; Paul C. Remus; Michelle Saquet Temple (57) ABSTRACT

The present invention is a polarizing process involving a number of steps. The first step requires moving a flowing mixture of gas, the gas at least containing a polarizable nuclear species and vapor of at least one alkali metal, with a transport velocity that is not negligible when compared with the natural velocity of diffusive transport. The second step is propagating laser light in a direction, preferably at least partially through a polarizing cell. The next step is directing the flowing gas along a direction generally opposite to the direction of laser light propagating. The next step is containing the flowing gas mixture in the polarizing cell. The final step is immersing the polarizing cell in a magnetic field. These steps can be initiated in any order, although the flowing gas, the propagating laser and the magnetic field immersion must be concurrently active for polarization to occur.

12 Claims, 6 Drawing Sheets

APPARATUS AND METHOD FOR POLARIZING POLARIZABLE NUCLEAR SPECIES

The instant application claims the benefit of U.S. Provisional Application Ser. No. 60/217,569 filed on Jul. 12, 2000.

GOVERNMENT SPONSORSHIP

This Invention was made with government support under DE-FG 02-88ER40410 awarded by the U.S. Department of Energy. The government has certain rights in the invention.

FIELD OF THE INVENTION

The present invention is in the field of hyperpolarizing polarizable nuclear species, such as xenon.

BACKGROUND OF THE INVENTION

Nuclear magnetic resonance (NMR) is a phenomenon, which can be induced through the application of energy against an atomic nucleus being held in a magnetic field. The nucleus, if it has a magnetic moment, can be aligned within an externally applied magnetic field. This alignment can then be transiently disturbed by application of a short burst of radio frequency energy to the system. The resulting disturbance of the nucleus manifests as a measurable resonance or wobble of the nucleus relative to the external field.

For any nucleus to interact with an external field, however, the nucleus must have a magnetic moment, i.e., non-zero spin. Experimental nuclear magnetic resonance techniques are, therefore, limited to study of those target samples, which include a significant proportion of nuclei exhibiting non-zero spin. Certain noble gases, including xenon, are in principle suited to study via NMR. However, the low relative natural abundance of these isotopes, their small magnetic moments, and other physical factors have made NMR study of these nuclei difficult if not impossible to accomplish.

Existing technology for polarizing xenon, developed primarily at Princeton, is based on earlier work on nuclear polarized 3He gas targets for nuclear physics. The key component of the system is the polarizing chamber where the 3He gas is heated, saturated with rubidium, an alkali metal vapor, and illuminated with laser light. In these devices, a closed cell of 3He gas, rubidium, and nitrogen is maintained at a uniform high temperature to achieve an appropriate rubidium density. A laser illuminates the cell with circularly polarized light at the resonant absorption line of the rubidium, polarizing the rubidium electrons. Spin exchange occurs with the 3He gas nucleus, leading to an accumulation of nuclear polarization. 3He gas atoms diffuse throughout the cell.

Xenon polarization proceeds by a similar mechanism. Circularly polarized laser light polarizes rubidium atoms, which in turn transfer their polarization to the xenon nucleus. Xenon, however, has a large depolarization effect on rubidium. Therefore the partial pressure of xenon must be kept low. Diode lasers, which are used to illuminate the gas mixture, have a large linewidth. In order to more efficiently absorb more of this laser light, the rubidium should be in a high-pressure gas to pressure-broaden the absorption line. Princeton researchers use a high-pressure buffer gas of helium. They slowly flow a mixture of xenon, nitrogen, and helium through the polarizing cell. A sufficient quantity of rubidium is available in the polarizing cell. The unpolarized gas slowly enters this chamber and diffusively mixes with rubidium vapor and partially polarized gas already in the chamber. Rubidium condenses as the gas exits and cools down.

The use of a high-pressure buffer gas, such as helium, causes pressure broadening of the absorption spectrum of the rubidium, allowing greater extraction of laser power in a compact pumping cell with low rubidium density. Operation at high-pressure, however, changes the dominant mechanism for transferring polarization from the rubidium to the xenon. At high pressures the dominant mechanism is the two-body interaction. At low pressures, the mechanism mediated by three-body formation of molecules dominates which is considerably more efficient. Consequently, the improvement in polarization achieved by the gain in laser efficiency is partially offset by a reduction in rubidium-xenon polarization transfer.

Existing polarization techniques also use a gas mixture dominated by helium at high pressure. The high pressure of helium broadens the absorption linewidth of the rubidium, allowing it to usefully absorb more of the linewidth of the diode laser. If they reduce the pressure, they would not absorb as much light in their short polarizing cells. If they lengthened their cells using their diffusively mixed process, they would mix gas from regions with an even greater range of polarization rates. If the existing process could be performed effectively at low pressure, however, the polarization system would be capable of taking advantage of the higher efficiently molecular formation physics.

Existing polarization methods cannot efficiently use the full polarizing power of the laser beam. The gas mixture attenuates the laser light. Consequently, the region of the polarizing cell farthest from the laser will only achieve low rubidium polarization if the cell is long. Since the gas in the polarization cell is diffusively mixed, the xenon will achieve an average polarization that is influenced by both the high rubidium polarization and the low rubidium polarization. To minimize the region of low rubidium polarization, the laser must exit the polarizing cell after using only a portion of its polarizing power.

SUMMARY OF THE INVENTION

The present invention results from the realization that by using a longer than standard polarizing cell and flow within the cell dominated by laminar displacement, polarizing polarizable nuclear species can be accomplished at low pressure with high temperature and high velocity, thereby taking advantage of the higher efficiency molecular formation physics.

It is therefore an object of this invention to dominate the flow through the cell by laminar displacement.

It is a further object of this invention to polarize polarizable nuclear species with high velocity.

It is a further object of this invention to increase efficient use of resonant light.

It is a further object of this invention to polarize polarizable nuclear species with high temperature.

It is therefore an object of this invention to polarize polarizable nuclear species at low pressure.

BRIEF DESCRIPTION OF THE INVENTION

The novel features believed characteristic of the invention are set forth in the claims. The invention itself however, as well as other features and advantages thereof, will be best understood by reference to the description which follows, read in conjunction with the accompanying drawings, wherein:

DETAILED DESCRIPTION OF THE INVENTION

Figure 1:
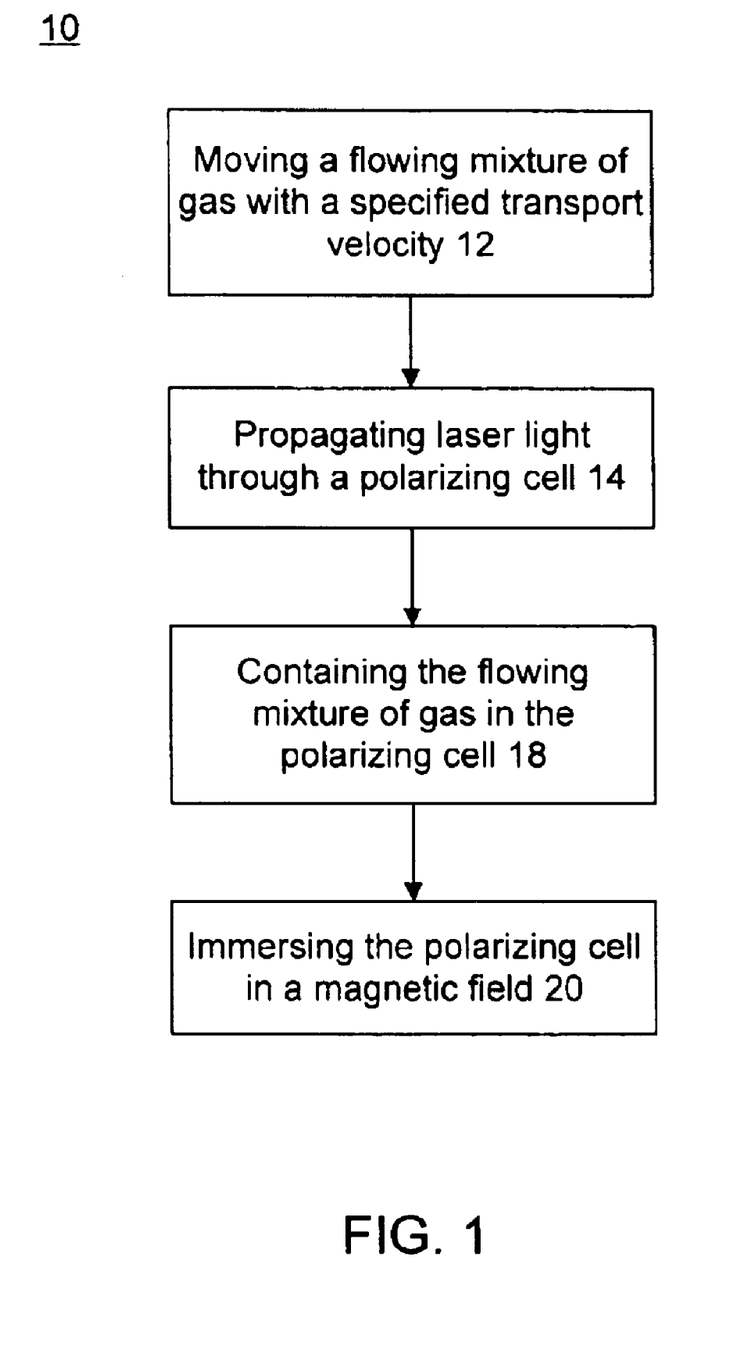
FIG. 1 shows a flow diagram with one embodiment of the inventive polarization method.
Figure 4:
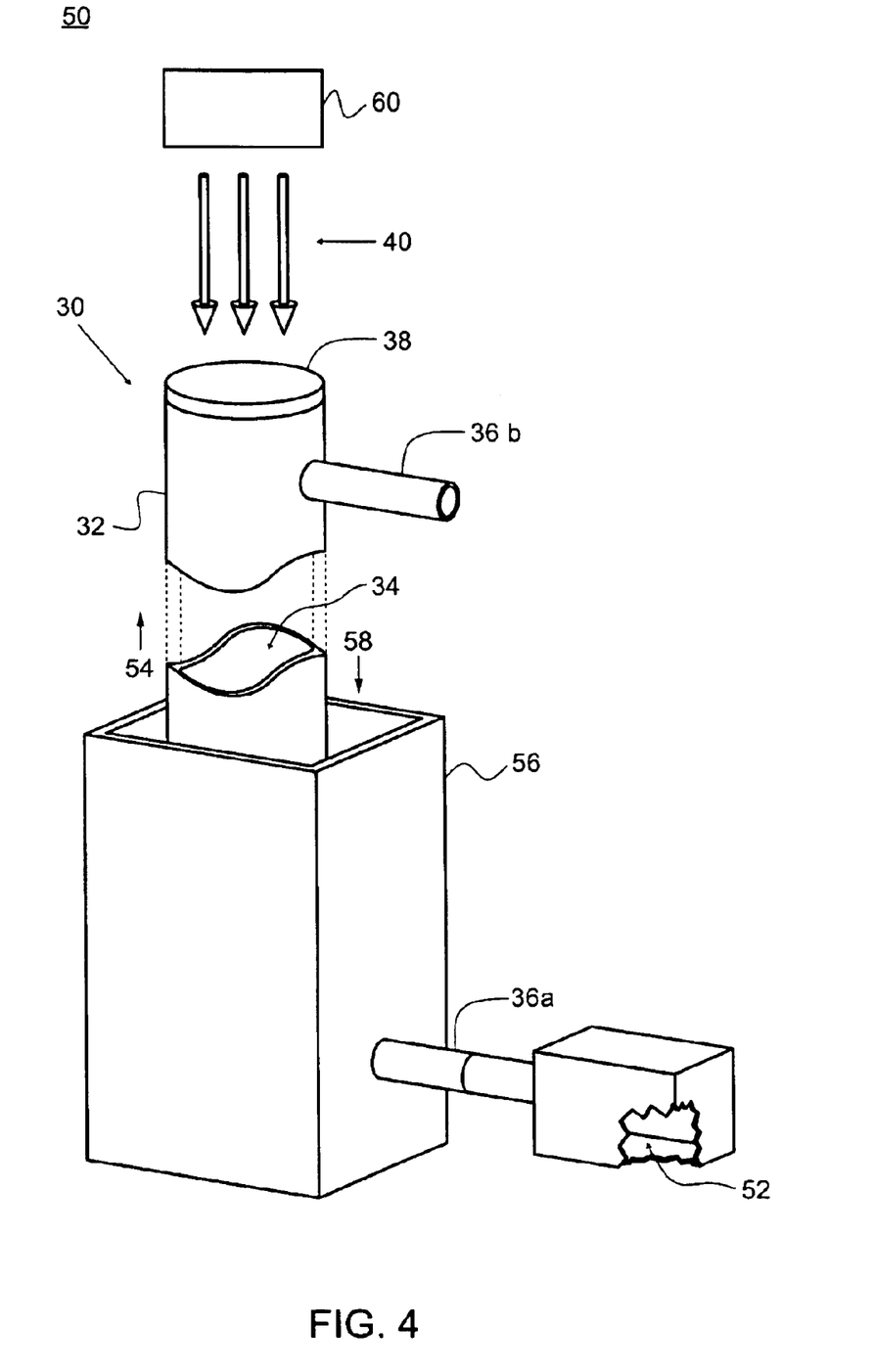
FIG. 4 shows a layout of one embodiment of the polarization apparatus.

The present invention is a polarizing process 10 involving a number of steps as shown in FIGS. 1 and 4. The first step requires moving 12 a flowing mixture of gas 52, the flowing mixture of gas 52 at least containing a polarizable nuclear species and vapor of at least one alkali metal, with a transport velocity that is not negligible when compared with a natural velocity of diffusive transport. The second step is propagating 14 laser light 40 in a direction 58, preferably at least partially through a polarizing cell 30. The next step is containing 18 the flowing gas 52 mixture in the polarizing cell 30. The final step is immersing 20 the polarizing cell 30 in a magnetic field. These steps can be initiated in any order, although moving 12 the flowing gas 52, propagating 14 the laser 40 and immersing 20 the magnetic field must be concurrently active for the polarizing process 10 to occur.

Figure 2:
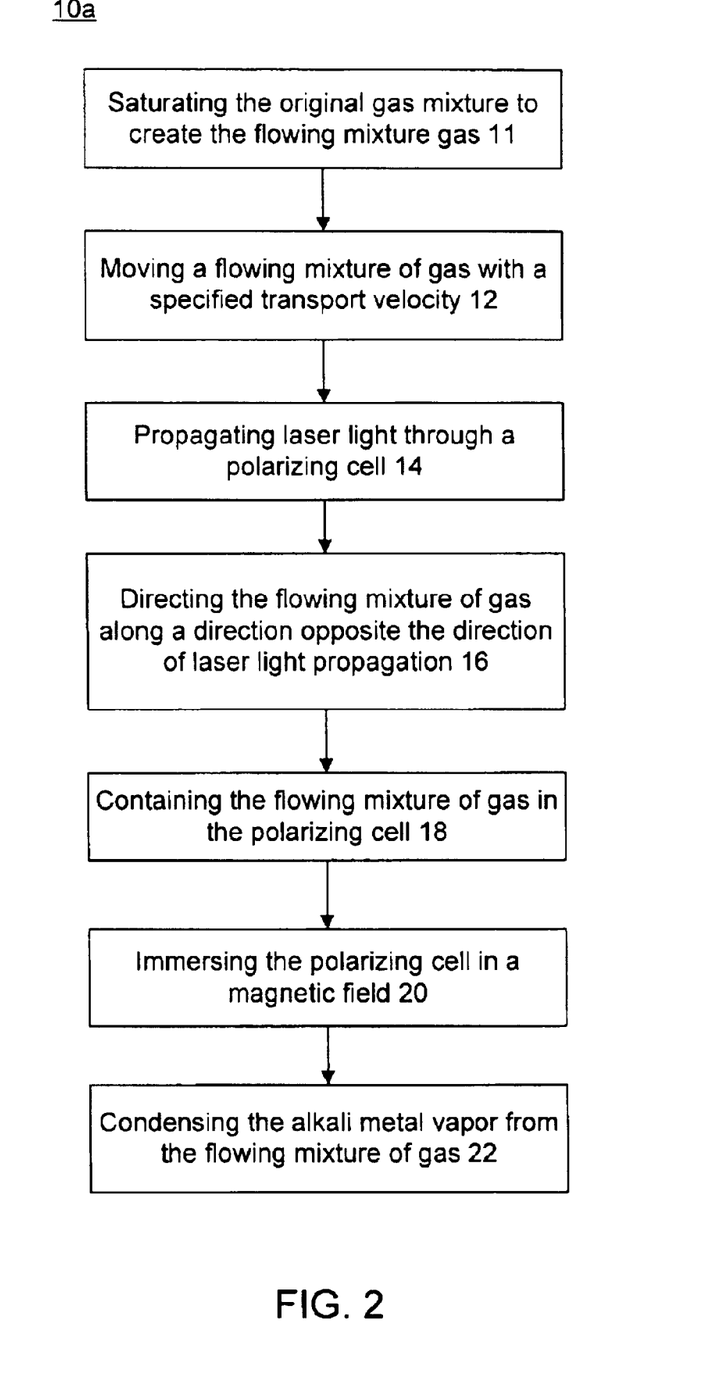
FIG. 2 shows a flow diagram of another embodiment of the inventive polarization method.

Additional steps can be added to the inventive process 10 as shown in FIG. 2. One narrower embodiment 10a involves saturating 11 an original gas mixture with the alkali metal vapor to create the flowing mixture of gas before the flowing mixture of gas enters the polarizing cell; directing 16 the flowing mixture of gas along a direction generally opposite to the direction of laser light propagation, and condensing 22 the alkali metal vapor from the flowing mixture of gas in the laser light.

Figure 3:
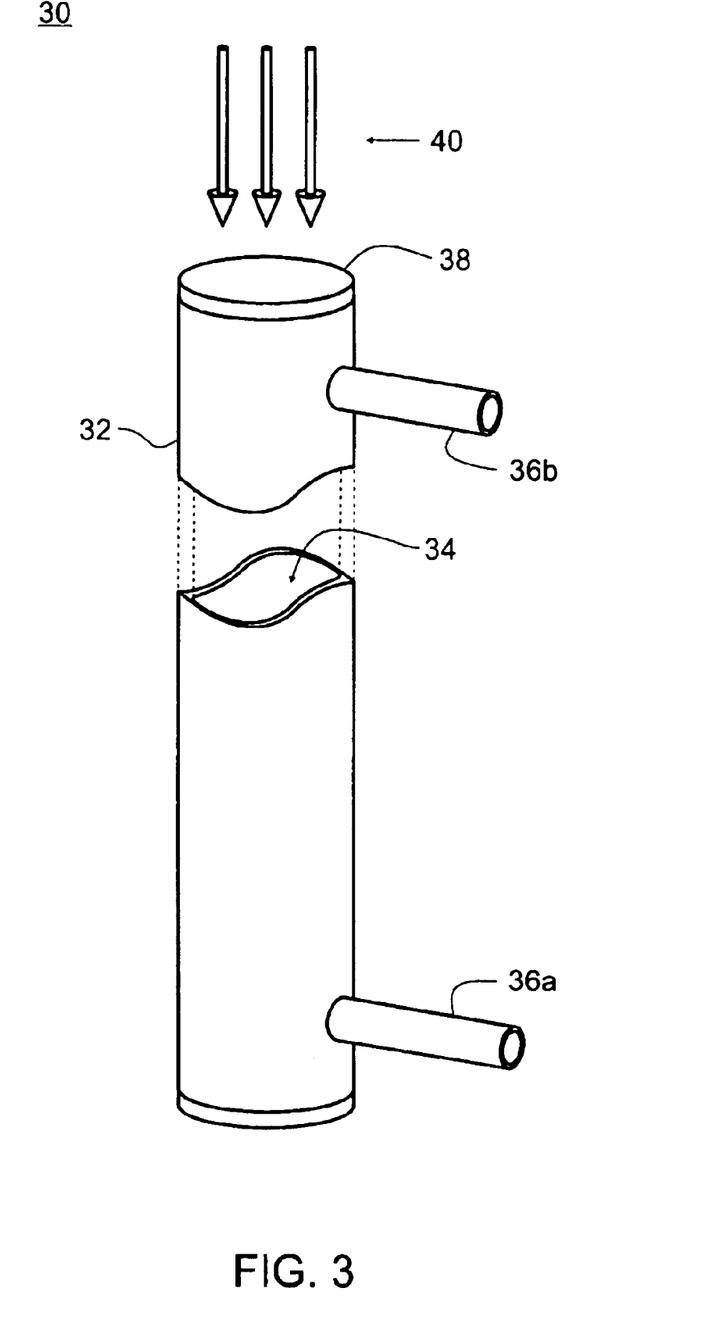
FIG. 3 shows one embodiment of the inventive polarization cell.

The present invention also includes an inventive polarizing cell 30 as shown on FIG. 3. The polarizing cell 30 is a nonferrous enclosure 32 with an interior 34 and at least two openings, an entrance 36a and an exit 36b, for flowing gas to pass through the enclosure 32. One embodiment of the polarizing cell 30 further includes a window 38 in the enclosure allowing laser light 40 to at least partially illuminate the interior 34. Another feature of this embodiment of the polarizing cell 30 is that the window 38 is maintained at a temperature substantially lower than most of the enclosure 32.

Another embodiment of the present invention also includes an inventive polarizing apparatus 50 as shown on FIG. 4. The inventive apparatus 50 includes a polarizing cell 30 with multiple openings an entrance 36a and an exit 36b, and at least one window 38 transparent to laser light 40. The apparatus further includes a flowing gas mixture 52, at least containing a polarizable nuclear species, at least one alkali metal vapor, and at least one quenching gas, moving 12 through the cell 30 in a direction 54. The apparatus 50 further includes an oven 56 at least partially containing the polarizing cell 30. The apparatus 50 further includes a laser propagating 14 light 40, at the absorption wavelength of the alkali metal vapor, through at least one transparent window 38 into the polarizing cell 30 in a direction 58 at least partially opposite to the direction 54 of the flowing gas mixture 52. Finally, the apparatus 50 includes an optical arrangement 60 to cause the laser light 40 to be substantially circularly polarized.

Figure 5:
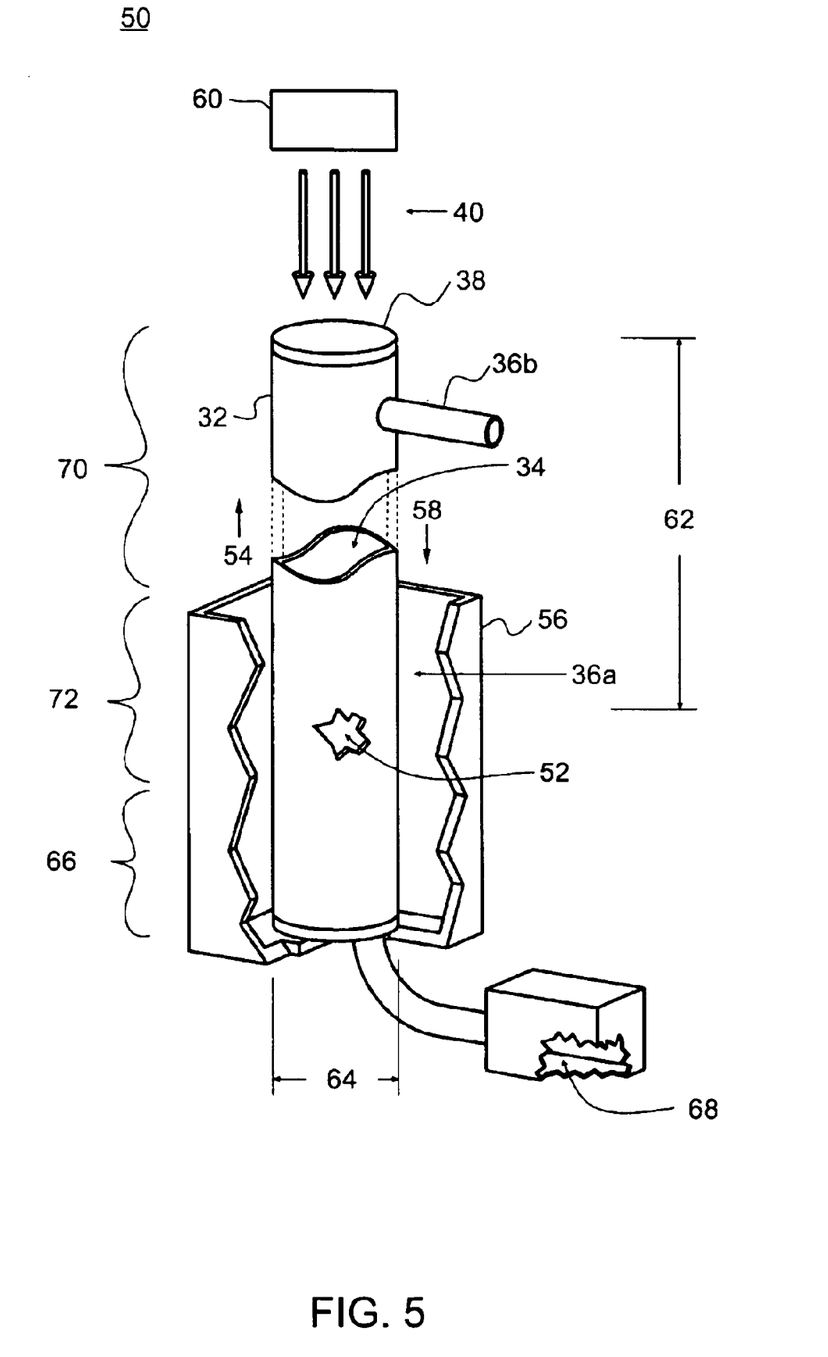
FIG. 5 shows a layout of another embodiment of the polarization apparatus.

The inventive apparatus 50 also has several narrower embodiments. One of the narrower embodiments involves having the oven 56 only partially containing the polarizing cell 30. A narrower embodiment of this embodiment involves using the previously described inventive polarizing cell 30 having the window maintained at a temperature substantially lower than most of the enclosure. Having the polarizing cell 30 sized so that it is more than five times greater in length 62 than diameter 64, as shown in FIG. 5, can further narrow this embodiment. In one embodiment, the cell can be ninety centimeters in length 62 and two centimeters in diameter 64.

Another embodiment of the apparatus 50 involves the oven 56 maintaining a temperature of over 150 C.

Another embodiment of the apparatus 50 includes having a saturation region 66 with a quantity of liquid alkali metal exposed to an original gas mixture 68 to substantially saturate 24 the original gas mixture 68 with an alkali metal vapor to create the flowing gas mixture 52 that flows 12 through the polarizing cell 30.

Another embodiment of the apparatus 50 includes having a condensation extension 70 of the polarizing cell 30, through which the laser light 40 propagates 14, before passing through a remainder 72 of the polarizing cell 30, for condensing 22 the alkali metal vapor in the laser light 40.

Another embodiment of the apparatus 50 includes composing the alkali metal vapor of rubidium, cesium and/or potassium.

Another embodiment of the apparatus 50 includes making the quenching gas nitrogen and/or hydrogen.

Existing practice in the polarization of polarizable nuclear species relies on the achievement of equilibrium conditions throughout the polarization chamber. The static polarization process of Rosen, Chupp et al uses very long (20 min) polarization time constants by selecting low temperature (90 C) and low rubidium density. Consequently they can use high xenon concentrations (more than one atmosphere). The quasistatic polarization process of Cates, Happer, et al uses shorter time constants (5 min) in a flowing system. By selecting higher temperature (up to 150 C) they have higher rubidium density. They must reduce their polarizable nuclear species pressure to a few percent of their working pressure of 10 atmospheres to maintain high rubidium polarization. The gases in their polarization chamber are diffusively mixed.

In contrast to existing practice, the present invention uses a flowing mixture of gas 52 whose flow velocity is not negligible when compared with the natural velocity of diffusive transport. The present invention is specified using this language because diffusion times are pressure dependent. Taking advantage of the transport will significantly improve performance over a wide range of pressures, both in existing operation regimes as well as in a preferred embodiment. Diffusion across a typical one-inch dimension requires one second at a pressure of one-tenth of an atmosphere and ten seconds at ten atmospheres in a typical gas mixture. The transport velocity is not negligible when compared with this velocity if it is, for example, greater than one-half this velocity. In a more favorable embodiment, the transport flow velocity will be several times this velocity, i.e. several inches per second. To achieve polarization in this regime requires polarization time constants more than one order of magnitude higher than the highest used in present practice, on order several seconds or faster. This requires higher rubidium densities to achieve faster time constants.

An analogy to the present polarization technique would be transferring a property such as heat from one fluid to another, which can be done with greater or lesser efficiency depending on the method employed. Placing the two fluids in thermal contact allows some of the heat to flow from one fluid to the other, until an equilibrium temperature is achieved. While a substantial amount of heat is transferred, a comparable amount remains in the original fluid. If the system is configured as a counter-flowing heat exchanger, the initially warmer fluid will transfer substantially all of its heat to the cooler fluid, exiting the exchanger at the initial temperature of the cooler fluid. The fluid that was initially cooler will exit with essentially all the heat.

The polarization process of the present invention relies on a similar principle. Referring again to FIGS. 1 and 4, the laser light 40 propagates 14 in a direction 58 generally opposite to the direction 54 of the flowing mixture of gas 52. The mixture of gas 52 gains in polarization even as it removes intensity from the laser light 40. Nevertheless, the highly polarized mixture of gas 52 exits the system 30 where the laser light 40 is most intense, maximizing the polarization of the mixture of gas 52.

The polarization process 10 must be immersed in a magnetic field to define the angular momentum quantization axis for the alkali metal vapor quantum mechanical spin states and the polarizable nuclear species nuclear spin states. The flowing gases 52 must also be confined and isolated from then environment. In the most favorable embodiment of polarizable nuclear species polarizing processes 10, the laser light 40 propagates 14 along the direction of a very uniform magnetic field. In the most favorable embodiment of the counterflowing polarizable nuclear species polarization process 10, the polarization cell 30 confining the flowing mixture of gas 52 is oriented such that the direction 54 of the mixture of gas 52 flow is exactly counter to the direction 58 of laser light 40 propagation 14. For higher flow velocities and longer cells, diffusional mixing decreases in significance, increasing the performance of the polarization system.

The gas pressure and mixture of gas 52 significantly affect the two stages of the polarization process 10, that is the transfer of polarization from the laser light 40 to the rubidium atoms, and the transfer of polarization from the rubidium atoms to the polarizable nuclear species nuclei. Existing practice uses four components in various amounts: the gas receiving the nuclear polarization, the alkali metal vapor, the quenching gas, and a buffer gas. The unpolarized fraction of the alkali metal vapor absorbs the laser light 40. Maximum polarization of the alkali metal vapor allows transmission of the laser light 40 to deeper regions of the polarizing cell 30. Higher concentration of alkali metal vapor (higher temperature) increases the rate of polarization transfer to the gas receiving the nuclear polarization, but absorbs more laser light 40. Higher concentrations of the gas receiving the nuclear polarization can also depolarize the alkali metal vapor, increasing the absorption of laser light 40. To effectively quench the atomic re-radiation, the quenching gas must have a pressure of several tens of torr, typically more than 60 torr. The pressure of all gases combined broadens the absorption spectrum of the alkali metal vapor, improving the utilization of the laser light for polarizing the alkali metal vapor. Higher pressures, however, reduce the alkali-xenon molecular formation, decreasing the rate of transfer of polarization from the alkali to the xenon.

The static, or batch-mode, process of Rosen, Chupp, et al, uses low temperatures, low rubidium density for approximately 20 minute time constant, high xenon concentration, intermediate pressure, and no buffer gas to increase pressure broadening. The quasi-static system of Cates, Happer, et al, uses intermediate temperatures and rubidium densities for time constants around a minute.

In one embodiment of the inventive process 10, the temperature is considerably higher than either of these methods. Alkali metal density is higher and the polarization time constant is shortened. Furthermore, if the overall pressure is low, polarization transfer from alkali to the species being polarized is further improved by the increase in transfer by molecular formation. To minimize the depolarization of the alkali vapor and maintain laser transmission, the density of the species being polarized should be low.

The short polarization time constant allows continuous rapid replacement of the mixture of gas 52, hence high velocity flow.

The opportunity to exploit this highly efficient polarization process 10 can be more favorably realized in an embodiment that causes the alkali metal vapor to become substantially condensed on the cell 30 walls while the mixture of gas 52 is still in the presence of the polarizing laser light 40. In one embodiment this can be accomplished by maintaining at least some portion of the polarizing cell 30, that portion which includes the gas exit opening 36b and laser entrance window 38, at a temperature substantially below that which would maintain an alkali vapor density constant in time. Note that when the mixed gas 52 leaves the polarizing cell 30, the alkali vapor density becomes quickly depolarized. That depolarization is transferred to the nuclear species being polarized at a rate that corresponds to the alkali metal vapor density at that point. Condensing the alkali metal vapor minimizes this depolarizing effect.

The polarization process 10 benefits from higher alkali metal densities and the associated shorter polarization time constant. In one embodiment of this process 10, the alkali metal saturates 11 into the original gas mixture 68 before entering the polarizing cell 30. Transport of the mixture of gas 52 from the alkali vapor saturation region ("presaturator") 66 to the polarizing cell 30 is maintained at an adequate temperature to deliver the mixture of gas 52 to the polarizing cell 30. In various embodiments, this alkali vapor presaturator 66 may or may not be collinear with the polarizing cell 30. In various embodiments, this alkali vapor presaturator 66 may or may not have a means of increasing the liquid-vapor surface area, such as a copper mesh insert.

High alkali metal vapor densities and high flow velocities will result in a substantial quantity of alkali metal transferred from the entrance opening 36a to the exit opening 36b of the polarizing cell 30. In embodiments where there is an alkali metal presaturator 66, the alkali metal source will diminish. In embodiments where there is an alkali metal condensation region 70, alkali metal will accumulate in this region 70. Excess accumulation could reduce the efficiency of operation. In one embodiment, the alkali metal accumulated in the condensation region 70 can be removed from the condensation region 70 without disassembling the polarization cell 30. In a more favorable embodiment, the condensed alkali metal can be returned to the polarizing cell 30 or the alkali metal presaturator 66 either by the force of the gravitational weight of the liquid droplets, or by the force of its weight aided by mechanical motion (shaking). This restoration may occur either with the cell 30 installed at least partially in a vertical orientation, or by reorienting the cell 30 to an at least partially vertical orientation.

Existing polarizing processes have not been able to exploit the highest alkali metal densities, and the associated highest polarization rates. The present process 10 exploits the motion 12 of the mixture of gas 52 to accomplish the stages of the polarization process 10 in sequential stages, allowing shorter time constants and higher polarization rates. In the most favorable embodiment of the inventive process 10, operating temperatures as high as 190 C can be exploited to achieve a polarization time constant of one-third of a second.

For a macroscopic sample of gas nuclei to become substantially polarized, the polarization rate must exceed the depolarization rate for that species. Noble gas spin one-half nuclei have two features that enable their polarization: they have closed electron shells thereby isolating the nucleus from asymmetric binding effects, and they have no electric quadrupole moment to allow the external surroundings to exert a torque on the nucleus. Consequently the depolarization times range from minutes for xenon-129, to hours for helium-3. A favorable application of the present polarization method 10 is the polarization of macroscopic samples of xenon-129 nuclei. The substantially reduced polarization time achievable by the present process 10, however, allows polarization of macroscopic samples of nuclei with much shorter depolarization times. Such species could include, but are not limited to xenon-131, which does not have a spin one-half nucleus, atomic hydrogen or deuterium, or even nuclei within molecules.

The novel elements of the embodiment of the present apparatus 50, as shown in FIG. 5, include a polarizing cell 30 immersed in a magnetic field. To allow for the mixture of gas 52 to flow through the cell 30, the cell 30 has at least one opening 36a for gases to enter, at least one opening 36b for gases to exit, and at least one transparent window 38 or provision for a source of laser light 40.

The openings 36a and 36b and shape of the cell 30 are optimized to allow for the mixture of gas 52 to flow at a velocity that can be greater than the velocity of diffusive transport. In a favorable embodiment, the polarizing cell 308 will have a length 62 that is greater than its transverse dimension 64. In a favorable embodiment the transparent window 30 will allow illumination of the full cross section of the cell 30 for a large fraction of its length 62. In a favorable embodiment the gas entrance opening 36a will be at the farthest end from the transparent window 38 and the exit opening 36b will be close to the transparent window 38. In a favorable embodiment, a substantial portion of length 62 of the cell 30 including the transparent window 38 and the gas exit opening 36b will be maintained at a temperature below the temperature used to obtain the operating density of alkali vapor, thereby causing the alkali to condense.

Again referring to FIGS. 1 and 5, the present polarization apparatus 50 also includes a saturation region 66 with a sufficient quantity of liquid alkali metal exposed over a sufficient surface area to substantially saturate 11 the original polarizable gas mixture 68 with alkali metal vapor to create the flowing mixture of gas 52 that enters the polarizing cell 30. This alkali vapor presaturator 66 is independently novel. In one embodiment it may consist of a sufficient length of tubing, either straight, wound in a helix, or some other configuration, containing several grams of alkali metal exposed over a large surface area. In another embodiment it may include a mesh of some material such as copper, to provide a large surface area. In another embodiment, it may consist of an extension of the same material, glass tubing for example, as comprises the polarization cell 30, with or without a copper mesh.

The present polarization apparatus 50 also includes an extension 70 of the polarizing cell 30 that is collinear with the polarizing cell 30, and through which the laser light 40 propagates 14 before entering the unextended portion 72 of polarizing cell 30 for condensing 22 the alkali vapor in the presence of the polarizing laser light 40. This extension 70 is closest to the exit opening 36b of the polarizing cell 30. This extension 70 acts as an alkali vapor condensation region. In one embodiment it is the same diameter 64 as the unextended portion 72 of polarizing cell 30. It projects out from the oven 56 into a region of lower temperature. In one embodiment this lower temperature is room temperature. In another embodiment, the extension 70 has a larger cross section than the unextended portion 72 of the polarizing cell 30. In still another embodiment the unextended portion 72 of the polarizing cell 30 can be at reduced temperature. This situation may be optimal for very high velocity flow when high alkali densities are prepared in the alkali presaturator 66.

In an embodiment optimized for very high velocities and high alkali densities, the entire polarizing cell may also be treated as the extension 70, acting as the condensing region.

Another narrower embodiment involves the polarizing cell 30 having a length 62 substantially greater than the laser light 40 attenuation length, thereby causing efficient transfer of polarization from the laser light 40 to the alkali metal vapor, even at low operating pressure where the most efficient alkali-polarizable nuclear species polarization transfer mechanism dominates.

Another narrower embodiment involves the transport velocity of the flowing mixture of gas 52 being substantially greater than the natural velocity of diffusive transport.

Another narrower embodiment of the inventive method 10 involves the polarizing cell 30 having an operating gas pressure that is less than two atmospheres but greater than a pressure required to efficiently quench an alkali optical pumping using a combination of at least 2 torr of a polarizable nuclear species and a minimum pressure of a quenching gas, typically 60 torr of nitrogen.

Another narrower embodiment involves the magnetic field being uniform and substantially aligned with the direction 58 of laser light 40 propagation 14.

Referring again to FIGS. 2 and 5, another narrower embodiment of the inventive method 10 includes the additional step of condensing 22 the alkali metal vapor from the gas mixture 52 in the propagating 14 laser light 40. A narrower embodiment of this embodiment involves the condensation 22 occurring in an extension 70 of the polarizing cell 30 that is collinear with the polarizing cell 30, and through which the laser light 40 propagates 14, thereby providing continuous polarization of the alkali metal vapor up to and during condensation 22. Another narrower embodiment of this embodiment involves the resulting condensed rubidium droplets coming to rest in either a saturating region 66, a region of the polarizing cell 30 heated by the oven 56, or both.

Another narrower embodiment involves the laser light 40 entering the polarizing cell 30 by passing through a window 38 of the polarizing cell 30 which is at a temperature substantially lower than that of the polarizing cell 30, thereby reducing attenuation of the laser light 40 in an unpolarized alkali metal vapor layer in contact with the window 38.

In a very favorable embodiment, the polarizing cell 30, the extension 70, and the alkali vapor presaturator 66 are fabricated from sections of tubing arranged coaxially. The diameter 64 of the tubing is 2.5 cm and the length is 2 meters. The tubing is oriented vertically in a uniform, vertical magnetic field. An opening at the bottom allows the original gas 68 to enter the alkali vapor presaturator 66. The alkali vapor presaturator 66 is maintained at a temperature of 200 C, and contains a copper mesh saturated with liquid alkali metal. The alkali vapor presaturator 66 occupies the lower 70 cm of the vertical tubing. The central 80 cm of the tubing comprise the unextended portion 72 of polarizing cell 30 in the oven 56. This region is maintained at 180 C. This region is fully illuminated with laser light 40 from above. The uppermost 50 cm of tubing comprise the extension 70 of the polarizing cell 30. This region is outside the oven 56, and maintained at room temperature. In this region, the alkali metal vapor diffuses to the walls and condenses 22. The length of this extension 70 must allow for several diffusion time constants to elapse while the mixture of gas 52 is passing through. A length of 50 cm and diameter of 2.5 cm allows gas velocity of approximately 15–20 cm/sec at pressure of 0.1 atmosphere. Higher flow velocities require a longer presaturation region 66 and extension 70.

Figure 6:
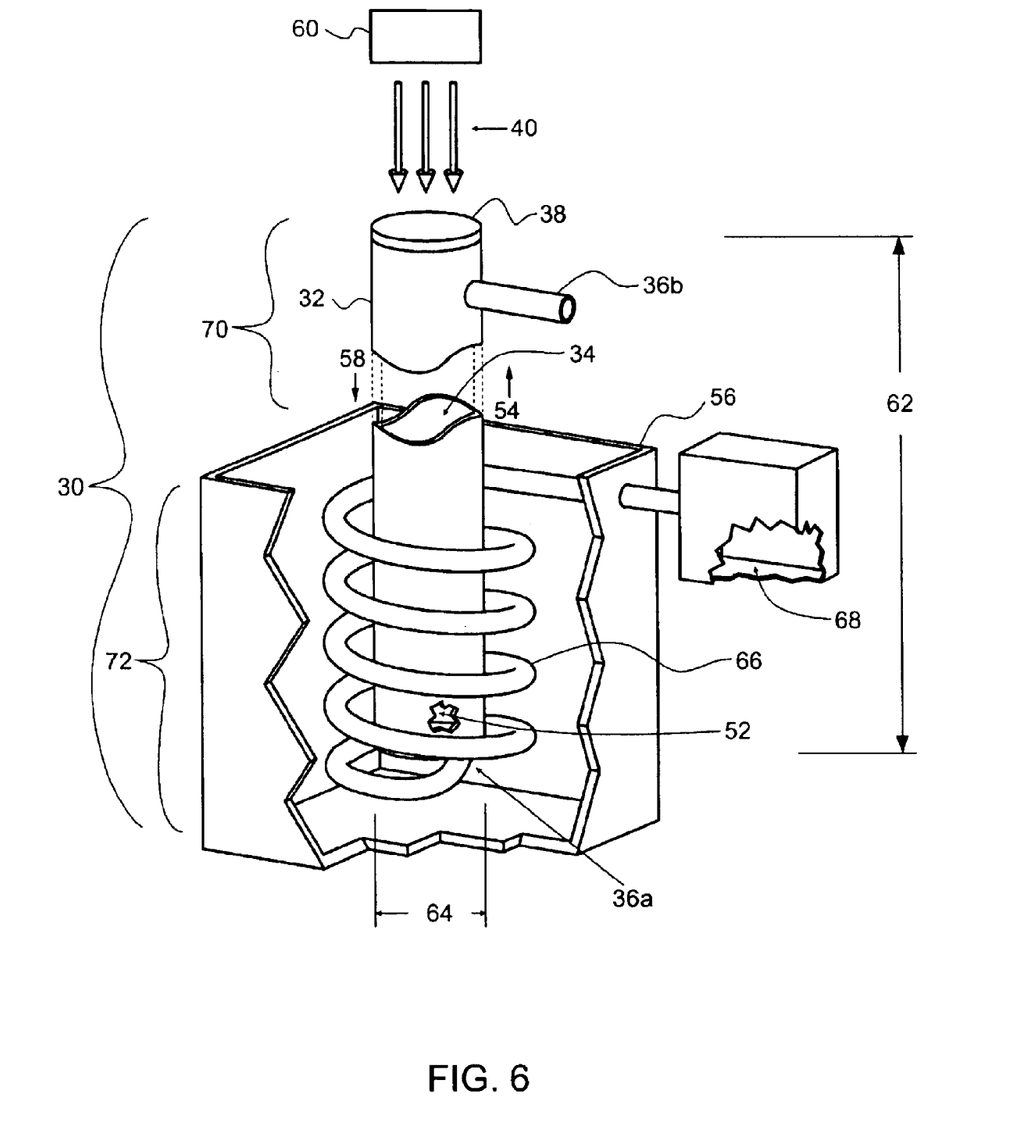
FIG. 6 shows a layout of another embodiment of the polarization apparatus.

In another embodiment, as shown in FIG. 6, optimized for higher flow velocities, higher temperatures, and shorter polarization time constants, the alkali metal presaturator 66 is not an extension of the polarizing cell 30. Rather, the alkali metal presaturator 66 consists of thirty turns of 2.5 cm diameter glass tubing, wound in a helix with 10 cm inner diameter. The tubing has been prepared with ridges to prevent the alkali metal liquid from flowing to the bottom. The exit of the alkali vapor presaturator 66 is connected at the bottom to the entrance opening 36a of the polarizing cell 30. The polarizing cell 30 is 2.5 cm diameter 64 glass tubing, oriented vertically. It is illuminated with laser light 40 through a window 38 from above. The unextended portion 72 of the polarizing cell that is in the oven 56 is 70 cm. The extension 70 of the polarizing cell 30 is a slightly larger diameter 64, 3.0 cm, and 130 cm in length. This embodiment allows production of polarizable gas with even higher temperatures and shorter polarization time constants. This system could operate optimally at 195 C and 40 cm/s flow rate achieving polarization time constants approaching one-fifth of a second.

We claim:

1. A polarizing process comprising:
   moving a flowing mixture of gas, at least containing a polarizable nuclear species and vapor of at least one alkali metal, with a transport velocity that is not negligible when compared with a natural velocity of diffusive transport;
   propagating laser light in a direction that intersects the flowing gas mixture; containing the flowing gas mixture in a polarizing cell; and
   immersing the polarizing cell in a magnetic field.

2. The process of claim 1 wherein the polarizing cell has a shape with a transverse dimension and a length substantially greater than its transverse dimension, such that the shape of the polarizing cell directs the flowing mixture of gas along a direction generally opposite to the direction of laser light propagation.

3. The process of claim 1 wherein the laser light has an attenuation length and the polarizing cell has a length substantially greater than the laser attenuation length, thereby causing efficient transfer of polarization from the laser to the alkali metal vapor, even at low operating pressure where the most efficient alkali-polarizable nuclear species polarization transfer mechanism dominates.

4. The process of claim 1 wherein the transport velocity of the flowing gas is substantially greater than the natural velocity of diffusive transport.

5. The process of claim 1 wherein the polarizing cell has an operating gas pressure that is less than two atmospheres but greater than a pressure required to efficiently quench an alkali optical pumping using a combination of at least 2 torr of a polarizable nuclear species and a minimum pressure of quenching gas, of at least 60 torr of nitrogen.

6. The process of claim 1 wherein the magnetic field is uniform and substantially aligned with the direction of laser light propagation.

7. The process of claim 1 further comprising:
   condensing the alkali metal vapor from the gas mixture in the propagated laser light.

8. The process of claim 7 wherein the condensation occurs in an extension of the polarizing cell that is collinear with the polarizing cell, and through which the laser propagates, thereby providing continuous polarization of the alkali metal vapor up to and during condensation.

9. The process of claim 7 wherein the condensing results in condensed rubidium droplets which come to rest in at least one of the following group of high temperature regions:
   a saturating region; and
   a heated region of the polarizing cell.

10. The process of claim 1 wherein the laser light enters the polarizing cell by passing through a window of the polarizing cell which is at a temperature substantially lower than that of the polarizing cell, thereby reducing attenuation of the laser light in an unpolarized alkali metal vapor layer in contact with the window.

11. The process of claim 1 further comprising:
    saturating an original gas mixture with the alkali metal vapor to create the following gas before the flowing gas enters the polarizing cell.

12. The process of claim 1 wherein the polarizing cell has an operating temperature that is greater than 150° C., thereby allowing faster polarization time constants and higher achievable polarization than existing practice.

* * * * *

UNITED STATES PATENT AND TRADEMARK OFFICE
CERTIFICATE OF CORRECTION

PATENT NO.        : 6,949,169 B2                                        Page 1 of 1
APPLICATION NO. : 09/904294
DATED             : September 27, 2005
INVENTOR(S)      : Hersman et al.

It is certified that error appears in the above-identified patent and that said Letters Patent is hereby corrected as shown below:

Column 1, line 9-13 delete text beginning with "Government Sponsorship" to and ending "in the invention."

Signed and Sealed this

Fourteenth Day of November, 2006

JON W. DUDAS
*Director of the United States Patent and Trademark Office*